(12) United States Patent
Shiraishi

(10) Patent No.: US 6,392,262 B1
(45) Date of Patent: May 21, 2002

(54) COMPOUND SEMICONDUCTOR DEVICE HAVING LOW-RESISTIVE OHMIC CONTACT ELECTRODE AND PROCESS FOR PRODUCING OHMIC ELECTRODE

(75) Inventor: Yasushi Shiraishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/491,638

(22) Filed: Jan. 27, 2000

(30) Foreign Application Priority Data

Jan. 28, 1999 (JP) ............................................. 11-020649

(51) Int. Cl.[7] ........................ H01L 29/80; H01L 31/112
(52) U.S. Cl. ........................ 257/280; 257/197; 257/198; 257/472
(58) Field of Search ................................ 257/280, 197, 257/198, 471, 472, 473, 474, 477–479, 745; 438/312, 313, 572, 573, 604–606, 575, 578

(56) References Cited

U.S. PATENT DOCUMENTS 4,796,082 A * 1/1989 Murakami et al. .......... 257/745
5,523,623 A * 6/1996 Yanagihara et al. ........ 257/745

FOREIGN PATENT DOCUMENTS

| JP | 5-259435 | 10/1993 |
| JP | 10-144622 | 5/1998 |
| JP | 11-274468 | 10/1999 |

OTHER PUBLICATIONS

Hiroyuki Okada; Electrical Characteristics and Reliability of Pt/Ti/Pt/Au Ohmic Contacts to p–Type GaAs; Japanese Journal Of Applied Physics; vol. 30, No. 4A, Apr., 1991, pp. L558–L560.

* cited by examiner

Primary Examiner—Olik Chaudhuri
Assistant Examiner—Theresa Doan
(74) Attorney, Agent, or Firm—Rosenman & Colin LLP

(57) ABSTRACT

An indium layer sandwiched between palladium layers are treated with heat so that the indium is diffused into a p-type gallium arsenide, and is alloyed with the palladium, whereby the p-type indium gallium arsenide layer decreases a Schottky barrier between the p-type gallium arsenide and the palladium-indium alloy layer.

19 Claims, 6 Drawing Sheets

COMPOUND SEMICONDUCTOR DEVICE HAVING LOW-RESISTIVE OHMIC CONTACT ELECTRODE AND PROCESS FOR PRODUCING OHMIC ELECTRODE

FIELD OF THE INVENTION

This invention relates to a compound semiconductor device and, more particularly, to a compound semiconductor device with improved ohmic electrodes and a process for producing an ohmic electrode incorporated in the compound semiconductor device.

DESCRIPTION OF THE RELATED ART

A hetero-junction bipolar transistor is an example of the compound semiconductor device. Several III–V compound semiconductor materials are used in the hetero-junction bipolar transistor, and electrodes form ohmic contacts together with one of the III–V compound semiconductor materials. Research and development efforts have been made for improvement in the heterojunction bipolar transistor. In order to enhance the stability and the reliability of the hetero-junction bipolar transistor, it is necessary to improve the contact resistance and the thermal stability of the ohmic contacts.

Conventionally, when the ohmic contact is formed on a p-type GaAs layer, a AuZn/Au laminated structure, a AuBe/Au laminated structure, a AuMn/Au laminated structure, a AuMg/Au laminated structure and Cr/Au laminated structure are popular to the electrode. However, these laminated structures are large in contact resistance and thermally unstable. The low thermal stability is derived from the gold, which is reactive with the gallium arsenide.

The ohmic contact is formed through the following processes. The first prior art process is disclosed by Takahashi in Japanese Patent Publication of Unexamined Application No. 5-259435. FIGS. 1A and 1B illustrate the first prior art process. The first prior art process starts with preparation of a semi-insulating GaAs substrate 100. A p-type GaAs layer 101 is grown on the semi-insulating GaAs substrate 100. A metal layer 102 of Pd, a metal layer 103 of Zn, a metal layer 104 of Pt and a metal layer 105 of Au are successively laminated over the p-type GaAs layer 101 as shown in FIG. 1A.

Subsequently, the resultant structure is subjected to a heat treatment at 300 degrees in centigrade. Pd reacts with GaAs in the heat treatment, and Pd and GaAs produce Pd-GaAs alloy layer 106 under the Pd layer 102. Moreover, Zn is diffused from the metal layer 103 into the p-type GaAs layer 101, and forms a heavily-doped p-type GaAs layer 107 under the Pd-GaAs alloy layer 106. The heavily-doped p-type GaAs layer 107 offers an ohmic contact. The metal layer 104 of Pt does not allow Au to be diffused into the p-type GaAs layer 101, and serves as a barrier layer against Au. This results in improvement in thermal stability.

The second prior art process is disclosed by Okada et al. in Japanese Journal of Applied Physics, 30, L558–L560 (1991). FIGS. 2A and 2B illustrate the second prior art process. The second prior art process starts with preparation of a semi-insulating GaAs substrate 100. A p-type GaAs layer 101 is grown on the semi-insulating GaAs substrate 100. A metal layer of Pt 108, a metal layer 109 of Ti, a metal layer 108a of Pt and a metal layer 110 of Au are successively laminated over the p-type GaAs layer 101.

Subsequently, the resultant structure is treated with heat. Namely, the resultant structure is heated to 400 degrees in centigrade, and is maintained in the high-temperature atmosphere for one minute. Pt reacts with GaAs, and Pt and GaAs produce a Pt-GaAs alloy layer 111. The Schottky barrier between Pt and p-type GaAs is low enough to form a low-resistive ohmic contact. The metal layer 108a of Pt blocks the p-type GaAs layer 101 from Au during the heat treatment, and, accordingly, the thermal stability is improved.

The present inventor had disclosed the third prior art process in Japanese Patent Application, which was published in 1998 as Japanese Patent Publication of Unexamined Application No. 10-144622. The third prior art process comprises the steps of successively forming a first layer, a second layer and a third layer on a substrate of III–V compound semiconductor and treating the resultant structure with heat in reducing gas. The third layer is formed of a first element, which serves as an n-type dopant impurity in the III–V compound semiconductor. The second layer is formed of a second element, which decreases the potential barrier height between the III–V compound semiconductor and metal. The first layer is formed of a third element, which reacts with the first element for producing a refractory alloy. An ohmic electrode is obtained through the heat treatment. The ohmic electrode and the n-type GaAs layer form ohmic contact, which is small in contact resistance. When many ohmic electrodes are formed on the substrate 100, the contact resistance is uniform between the ohmic contacts. Furthermore, the contact resistance between the lots falls within a narrow range.

Although the metal layer 104/108a of Pt is formed under the metal layer 105/110 of Au, the metal layer 104/108a can not perfectly block the GaAs layer 101 from Au. A small amount of Au penetrates the metal layer 104/108a, and reaches the p-type GaAs layer 101 in a long operating time. Au atoms react with GaAs. As a result, the prior art compound semiconductor device loses the thermal stability, and the contact resistance is increased. When the prior art ohmic electrode serves as a base electrode of the hetero-bipolar transistor, Au is further diffused through the base region into the collector region, and the collector breakdown voltage is lowered. Thus, the first problem inherent in the first and second prior arts is the imperfect barrier against Au atoms.

Another problem inherent in the first and second prior arts is a relatively high contact resistance. It is difficult to reduce the contact resistance equal to or less than $1 \times 10^{-7}$ $\Omega cm^2$. Yet another problem encountered in the first and second prior arts is the production cost. The prior art ohmic electrodes require the noble metals, i.e., platinum and gold, and the noble metals increase the production cost.

The ohmic electrode formed through the third prior art process is free from the above-described problems. However, the third prior art process is applicable to the n-type GaAs substrate, only. In other words, the ohmic electrode is not formed on a p-type GaAs layer. Thus, the problem inherent in the third prior art process is the limitation to the conductivity type.

SUMMARY OF THE INVENTION

It is therefore an important object of the present invention to provide a compound semiconductor device, which has an electrode low in contact resistance and thermally stable on a compound semiconductor device regardless of the conductivity type.

It is also an important object of the present invention to provide a process for producing an ohmic contact, which is thermally stable, low in contact resistance and production cost and available for both of an n-type compound semiconductor layer and a p-type compound semiconductor layer.

In accordance with one aspect of the present invention, there is provided a compound semiconductor device comprising a substrate, at least one active layer formed of a first compound semiconductor material capable of producing a first Schottky barrier together with a metal and formed over the substrate and at least one electrode formed on the at least one active layer and including a first layer formed of a second compound semiconductor material containing a first element and the elements of the first compound semiconductor material and capable of producing a second Schottky barrier lower than the first Schottky barrier together with the metal and a second layer formed of an refractory alloy containing the first element and a second element.

In accordance with another aspect of the present invention, there is provided a process for producing an ohmic electrode comprising the steps of a) preparing a multiple-layered structure including a first compound semiconductor capable of producing a first Schottky barrier together with a metal and having a contact area, b) forming a preliminary electrode layer containing a first element and a second element on the contact area and c) heating the resultant structure at the step b) so as to produce an ohmic electrode including a first layer formed of a second compound semiconductor material containing the first element and the elements of the first compound semiconductor material and capable of producing a second Schottky barrier lower than the first Schottky barrier together with the metal and a second layer formed of an refractory alloy containing the first element and the second element.

BRIEF DESCRIPTION OF THE DRAWINGS

The features and advantages of the processes will be more clearly understood from the following description taken in conjunction with the accompanying drawings in which.

DESCRIPTION OF THE PREFERRED EMBODIMENTS

Process for Producing Ohmic Electrode
First Embodiment

FIGS. 3A to 3D show a process for producing an ohmic electrode embodying the present invention. In this instance, indium and palladium serve as the first element and the second element.

The process starts with preparation of a semi-insulating substrate 1 of III–V compound semiconductor such as gallium arsenide. The gallium arsenide is hereinbelow expressed as GaAs. P-type GaAs is epitaxially grown on the major surface of the semi-insulating substrate 1, and forms a p-type GaAs layer 2. A molecular beam epitaxy or a metalorganic chemical vapor deposition is available for the epitaxial growth.

Figure 3A:
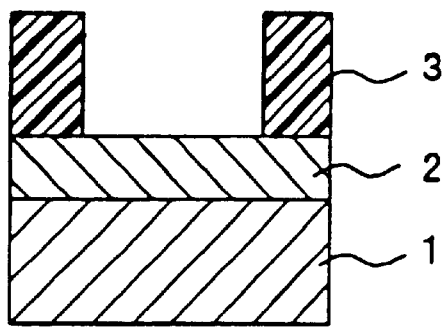
FIGS. 3A to 3D are cross sectional views showing a process for producing an ohmic electrode according to the present invention.

Subsequently, a photo-resist mask 3 is formed on the p-type GaAs layer 2, and an area assigned to an ohmic contact is exposed to an opening formed in the photo-resist mask 3 as shown in FIG. 3A.

Figure 3B:
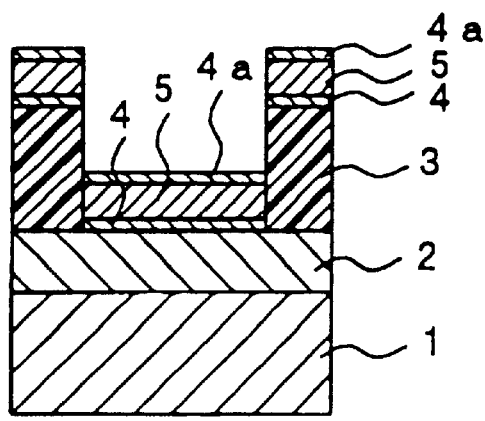

Subsequently, palladium Pd is deposited over the entire surface of the resultant structure, and forms a palladium layer 4. Indium In is deposited over the palladium layer 4, and forms an indium layer 5 on the palladium layer 4. Palladium is deposited over the indium layer 5, again, and forms a palladium layer 4a on the indium layer 5 as shown in FIG. 3B. The palladium and the indium may be deposited by using a vacuum evaporation or a sputtering. In this instance, the palladium layer 4 is 30 nanometers thick, the indium layer 5 is 120 nanometers thick, and the palladium layer 4a is 30 nanometers thick.

Figure 3C:
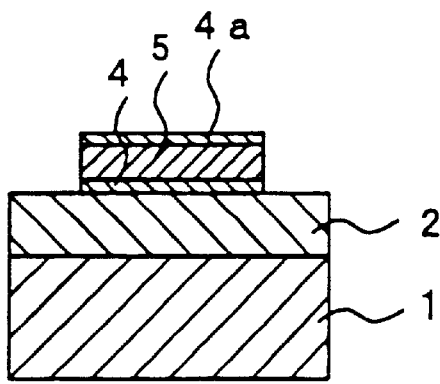
Figure 3D:
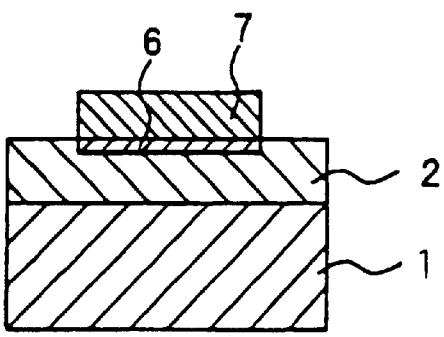

Subsequently, the photo-resist mask 3 is removed from the p-type GaAs layer 2 by using organic solvent. The photo-resist mask 3 is separated from the p-type GaAs layer 2 together with the palladium layer 4, the indium layer 5 and the palladium layer 4a deposited thereon. A part of the palladium layer 4, a part of the indium layer 5 and a part of the palladium layer 4a are left on the area assigned to an ohmic contact as shown in FIG. 3C. Thus, the laminated structure of the palladium layer 4, the indium layer 5 and the palladium layer 4a is formed on the area assigned to the ohmic contact through a lift-off technique.

Subsequently, the resultant structure is placed in nitrogen atmosphere. The resultant structure is heated to 350 degrees in centigrade by using a rapid thermal annealing technique, and is maintained for 5 seconds. An electric furnace is available for the annealing. The indium is diffused into the p-type GaAs layer 2, and the gallium arsenide is alloyed with the indium. The alloying results in p-type indium gallium arsenide, and a p-type InGaAs layer 6 is formed in the p-type GaAs layer 2. The palladium is alloyed with the indium, and a PdIn alloy layer 7 is formed over the p-type InGaAs layer 6. The PdIn alloy layer 7 and the p-type InGaAs layer 6 as a whole constitute an ohmic electrode. The p-type InGaAs layer 6 decreases the potential barrier between the p-type GaAs layer 2 and the PdIn alloy layer 7, and the contact resistance is lowered.

In this instance, the rapid thermal annealing is carried out in the nitrogen atmosphere. The nitrogen gas is replaceable with a kind of reducing gas such as, for example, hydrogen. When the rapid thermal annealing is carried out in the reducing gas atmosphere, the contact resistance is further decreased.

The present inventor produced the ohmic electrode on the p-type GaAs layer 2 through the process shown in FIGS. 3A to 3D, and measured the contact resistance between the ohmic electrode and the p-type GaAs layer 2. The contact resistance was $2 \times 10^{-8}$ $\Omega cm^2$. Thus, the contact resistance was surely decreased by virtue of the p-type InGaAs layer 6.

The present inventor carried out an annealing in the nitrogen atmosphere and in order to investigate the stability. The structure shown in FIG. 3D was placed in the nitrogen atmosphere at 400 degrees in centigrade for 10 hours. For the comparison, the prior art ohmic electrode shown in FIG.

2B was annealed under the same conditions. The present inventor measured the contact resistance before the annealing and after the annealing. The increment of the contact resistance in the structure shown in FIG. 3D was much less than the increment of the contact resistance in the prior art structure. The present inventor observed the ohmic electrode, and confirmed that the surface morphology was substantially unchanged. Finally, the present inventor checked the ohmic contacts fabricated on the same wafer and the ohmic contacts fabricated in different lots for dispersion of contact resistance. The present inventor confirmed that the contact resistance was uniform on the same wafer and between the difference lots. If the nitrogen is replaced with hydrogen, similar results will be obtained.

In the above-described embodiment, the indium layer 5 is sandwiched between the palladium layers 4 and 4a. However, the present invention is never limited to the three-layered structure 4/5/4a. A two-layered structure, i.e., the indium layer 5 laminated on the palladium layer 4 may be used for a process according to the present invention. A five-layered structure is also available for the process according to the present invention. In this instance, a palladium layer, an indium layer, a palladium layer, an indium layer and a palladium layer are successively laminated over a compound semiconductor layer, and the palladium layers and the indium layers are thinner than the palladium layer 4/4a and the indium layer 5, respectively. This feature is desirable, because the surface morphology is further improved. In detail, indium tends to agglomerate, and the agglomeration is causative of a rough surface. Moreover, the indium is alloyed with the palladium, and makes the surface rough. Nevertheless, when the thin indium layers are altered with the thin palladium layers, the agglomeration and the alloying do not seriously roughen the surface, and good surface morphology is obtained. Thus, it is desirable to increase the palladium layers and the indium layers.

Moreover, palladium and indium may be concurrently deposited on the compound semiconductor layer. A co-evaporation may be used for the concurrent deposition. The deposition may be carried out at a low temperature. The low-temperature deposition restricts the agglomeration of the indium and the alloying between the indium and the palladium, and improves the surface morphology.

In the above-described embodiment, the ohmic electrode 6/7 is formed over the p-type GaAs layer 2. Even if an n-type GaAs layer is grown on the semi-insulating substrate 1, an n-type InGaAs layer is regrown through a solid-phase epitaxy, and decreases the potential barrier between the PdIn alloy layer 7 and the n-type GaAs layer. This means that even though a p-type GaAs layer and an n-type GaAs layer are formed on a single semi-insulating substrate, the ohmic electrodes are concurrently formed on the p-type GaAs layer and the n-type GaAs layer. Thus, the present invention is available for the p-type GaAs layer 2 as well as the n-type GaAs layer, and the fabrication process is simplified.

Second Embodiment

FIGS. 4A to 4D show another process for producing an ohmic electrode embodying the present invention. In this instance, indium, palladium and zinc serve as the first element, the second element and the third element, respectively.

The process starts with preparation of a semi-insulating substrate 1 of III–V compound semiconductor such as gallium arsenide. P-type GaAs is epitaxially grown on the major surface of the semi-insulating substrate 1 by using the molecular beam epitaxy or the metalorganic chemical vapor deposition, and forms a p-type GaAs layer 2.

Figure 4A:
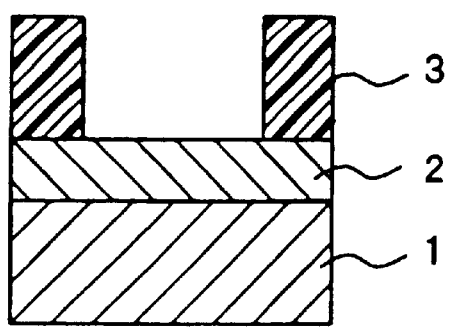
FIGS. 4A to 4D are cross sectional views showing another process for producing an ohmic electrode according to the present invention.
Figure 4B:
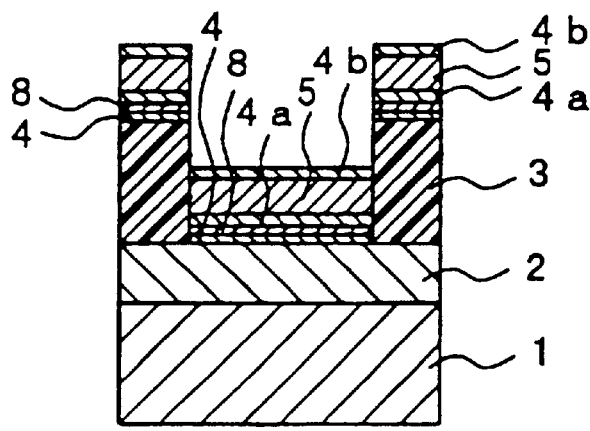

Subsequently, a photo-resist mask 3 is formed on the p-type GaAs layer 2, and an area assigned to an ohmic contact is exposed to an opening formed in the photo-resist mask 3 as shown in FIG. 4A.

Subsequently, palladium Pd is deposited to 15 nanometers thick over the entire surface of the resultant structure, and forms a palladium layer 4. Zinc Zn is deposited to 3 nanometers thick over the palladium layer 4, and forms a zinc layer 8. Palladium is deposited to 15 nanometers thick over the zinc layer 8, and forms a palladium layer 4a. Indium In is deposited to 120 nanometers thick over the palladium layer 4a, and forms an indium layer 5 on the palladium layer 4a. Palladium is deposited to 30 nanometers thick over the indium layer 5, and forms a palladium layer 4b on the indium layer 5 as shown in FIG. 3B. The palladium, the zinc and the indium may be deposited by using a vacuum evaporation or a sputtering.

Figure 4C:
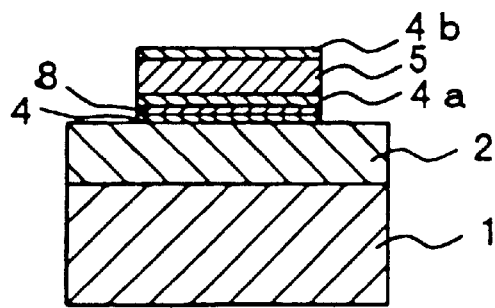

Subsequently, the photo-resist mask 3 is removed from the p-type GaAs layer 2 by using organic solvent. The photo-resist mask 3 is separated from the p-type GaAs layer 2 together with the palladium layer 4, the zinc layer 8, the palladium layer 4a, the indium layer 5 and the palladium layer 4b deposited thereon. A part of the palladium layer 4, a part of the zinc layer 8, a part of the palladium layer 4a, a part of the indium layer 5 and a part of the palladium layer 4b are left on the area assigned to an ohmic contact as shown in FIG. 4C. Thus, the laminated structure of the palladium layer 4, the zinc layer 8, the palladium layer 4a, the indium layer 5 and the palladium layer 4b is formed on the area assigned to the ohmic contact through the lift-off technique.

Figure 4D:
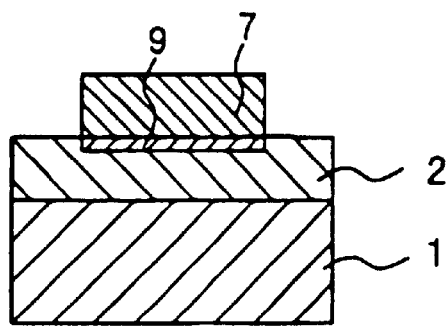

Subsequently, the resultant structure is placed in nitrogen atmosphere. The resultant structure is heated to 350 degrees in centigrade by using a rapid thermal annealing technique, and is maintained for 5 seconds. The indium and the zinc are diffused into the p-type GaAs layer 2. The gallium arsenide is alloyed with the indium, and the zinc increases the p-type dopant concentration in the p-type gallium arsenide layer 2. The alloying results in p-type indium gallium arsenide, and a heavily-doped p-type InGaAs layer 9 is formed. The palladium is alloyed with the indium, and a PdIn alloy layer 7 is formed over the heavily-doped p-type InGaAs layer 9. The PdIn alloy layer 7 and the heavily-doped p-type InGaAs layer 9 as a whole constitute an ohmic electrode as shown in FIG. 4D. The heavily-doped p-type InGaAs layer 9 decreases the potential barrier between the p-type GaAs layer 2 and the PdIn alloy layer 7, and the p-type dopant impurity i.e., zinc further lowers the contact resistance.

The present inventor produced the ohmic electrode 7/9 through the process shown in FIGS. 4A to 4D, and measured the contact resistance between the ohmic electrode 7/9 and the p-type GaAs layer 2. The contact resistance was $8 \times 10^{-9}$ $\Omega cm^2$, and was lower than the contact resistance of the ohmic electrode 6/7. Thus, the heavily-doped InGaAs layer 9 surely decreases the contact resistance.

In the second embodiment, zinc is used as the p-type dopant impurity. However, the dopant impurity is never limited to the zinc. Mn, Mg, Be, C, Ge and/or Si may be used as the p-type dopant impurity or the third element. Zn and Mn are preferable, because they are easily formed into a thin layer through the evaporation and so forth and activated at a relatively low temperature annealing.

In the second embodiment, the rapid thermal annealing is carried out in the nitrogen atmosphere. The nitrogen atmosphere is replaceable with a kind of reducing gas such as, for example, hydrogen as similar to the first embodiment. When the rapid thermal annealing is carried out in the reducing gas atmosphere, the contact resistance is further decreased.

Figure 1A:
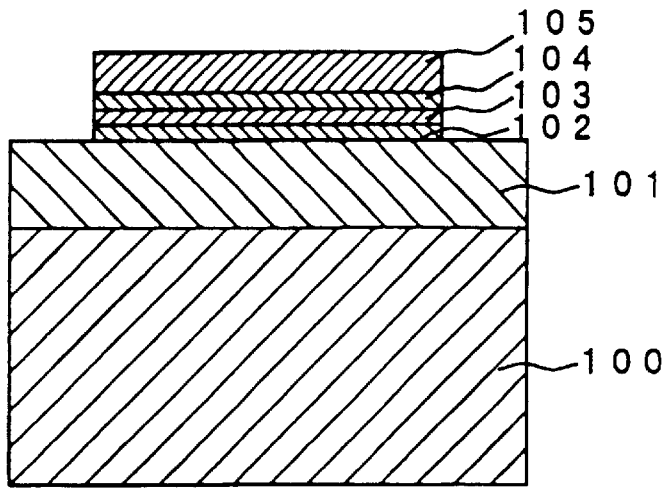
FIGS. 1A and 1B are cross sectional views showing the first prior art process disclosed in Japanese Patent Publication of Unexamined Application No. 5-259435.
Figure 1B:
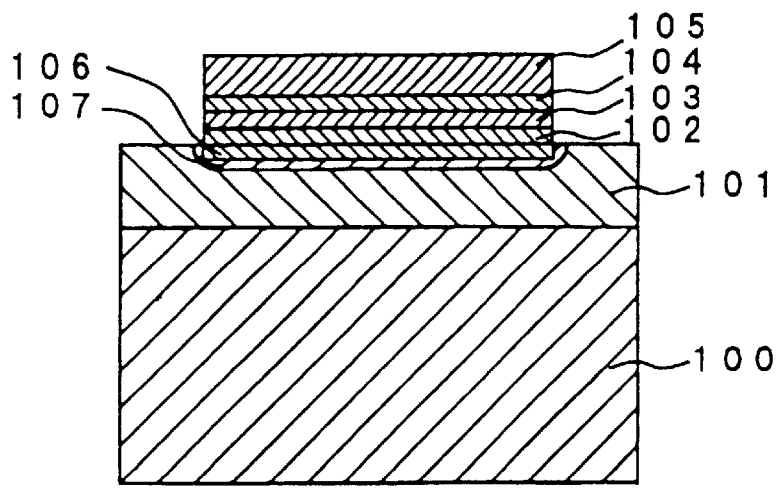
Figure 2A:
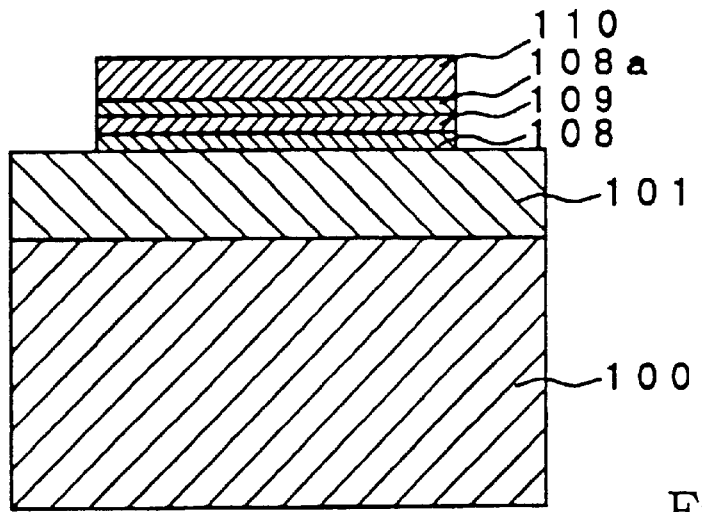
FIG. 2A and 2B are cross sectional views showing the second prior art process disclosed in Japanese Journal of Applied Physics.
Figure 2B:
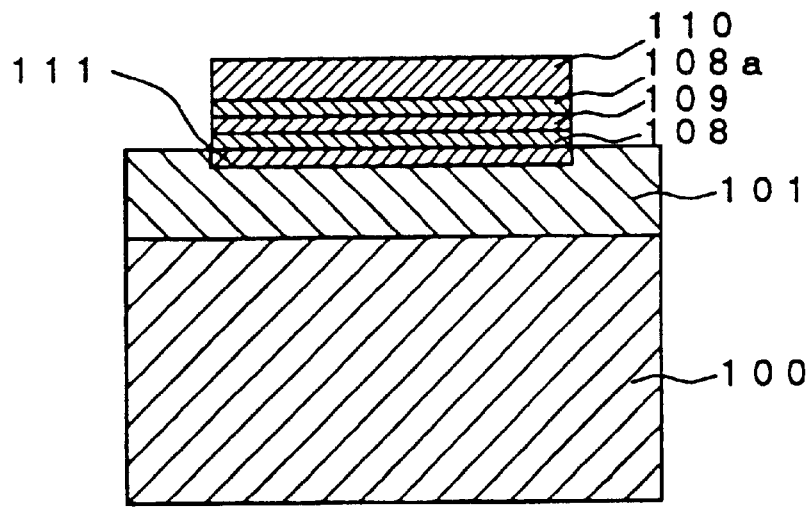

The present inventor carried out an annealing in the nitrogen atmosphere and in order to investigate the stability. The structure shown in FIG. 4D was placed in the nitrogen atmosphere at 400 degrees in centigrade for 10 hours. For the comparison, the prior art ohmic electrode shown in FIG. 2B was annealed under the same conditions. The present inventor measured the contact resistance before the annealing and after the annealing. The increment of the contact resistance in the structure shown in FIG. 4D was much smaller than the increment of the contact resistance in the prior art structure. The present inventor observed the ohmic electrode 7/9, and confirmed that the surface morphology was substantially unchanged. Finally, the present inventor checked the ohmic contacts 7/9 on the same wafer and the ohmic contacts 7/9 between different lots for dispersion. The present inventor confirmed that the contact resistance was uniform on the same wafer and between the difference lots. If the nitrogen is replaced with hydrogen, similar results will be obtained.

Although the five-layered structure consisting of the palladium layer 4, the zinc layer 8, the palladium layer 4a, the indium layer 5 and the palladium layer 4b is used in the process implementing the second embodiment, another multiple-layered structure is available for the process. Another multiple layered structure may consist of a palladium-zinc layer, an indium layer and a palladium layer. Palladium and zinc are co-evaporated for forming the palladium-zinc layer. Yet another multiple layered structure may consist of the palladium layer 4, the zinc layer 8 and the indium layer 5. Still another multiple-layered structure may consist of a palladium layer, a zinc layer, a palladium layer, an indium layer, a palladium layer, an indium layer, a palladium layer, an indium layer and a palladium layer, and the palladium layers and the indium layers are thinner than the palladium layers 4/4a/4b and the indium layer 5. The more the palladium/indium layers, the better the surface morphology.

The three elements, the palladium/zinc/indium are selectively co-evaporated. A multiple-layered structure may contain a palladium-indium layer and/or a palladium-indium-zinc layer. These layers further improves the surface morphology. When the evaporation or the co-evaporation is carried out at a low temperature, the agglomeration of indium and the reaction between the indium and the palladium are restricted, and the restriction makes the surface morphology better.

Structure of Compound Semiconductor Device
First Embodiment

Figure 5:
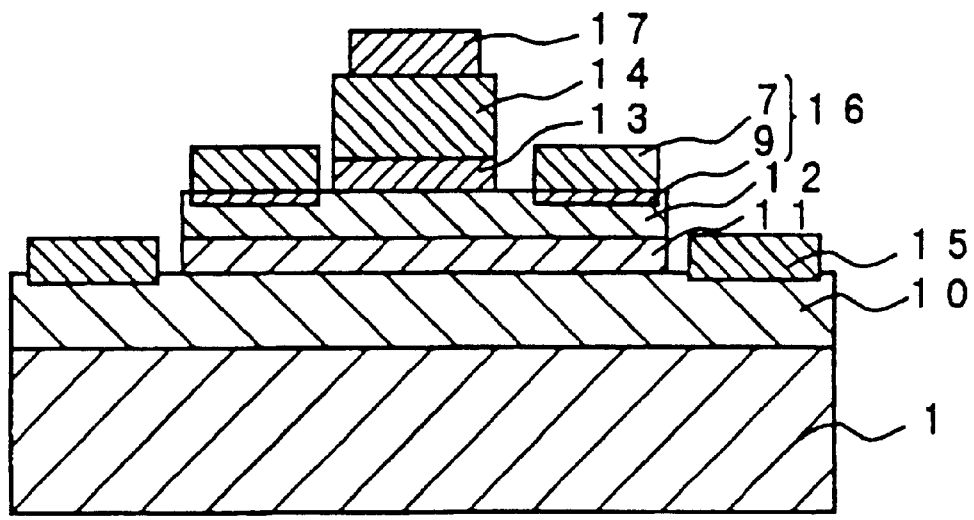
FIG. 5 is a cross sectional view showing a hetero-junction bipolar transistor according to the present invention.

Referring to FIG. 5 of the drawings, a hetero-junction bipolar transistor embodying the present invention is fabricated on a semi-insulating substrate 1 of GaAs. A sub-collector layer 10 of heavily-doped n-type GaAs is grown on the major surface of the semi-insulating substrate 1. On the sub-collector layer 10 are successively grown a collector layer 11 of lightly-doped GaAs, a base layer 12 of heavily-doped p-type GaAs, an emitter layer 13 of n-type AlGaAs and an emitter cap layer 14 of heavily-doped n-type InGaAs.

The sub-collector layer 10 are exposed on both sides of the collector/base layers 11/12, and a collector electrode 15 is formed on the exposed surfaces of the semi-collector layer 10. The base layer 12 is exposed on both sides of the emitter/emitter cap layers 13/14, and a base electrode 16 is formed on the exposed surface of the base layer 12. An emitter electrode 17 is formed on the emitter cap layer 14.

The emitter electrode 17 is formed of refractory metal silicide such as, for example, WSi. Tungsten silicide is deposited through a sputtering, and the tungsten silicide layer is patterned through lithography and a dry etching.

On the other hand, the collector electrode 15 is formed of Au—Ge—Ni alloy. A photo-resist mask (not shown) is formed on the sub-collector layer 10, and the AuGe alloy and the nickel are successively deposited over the entire surface. The photo-resist mask is removed together with the AuGe alloy layer and the nickel layer deposited thereon, and the collector electrode 15 is left on the sub-collector layer 10.

The base electrode 16 is identical with the ohmic electrode 7/9. Namely, the heavily-doped p-type InGaAs layer 9 and the PdIn alloy layer 7 form in combination the base electrode 16. The base electrode 16 is extremely low in contact resistance and thermally stable. This results in a highly reliable and well reproducible hetero-junction bipolar transistor. Any noble metal is not used for the ohmic electrode according to the present invention, and the fabrication process consists of the known technologies. The production yield is improved, and the production cost is reduced.

Second Embodiment

Figure 6:
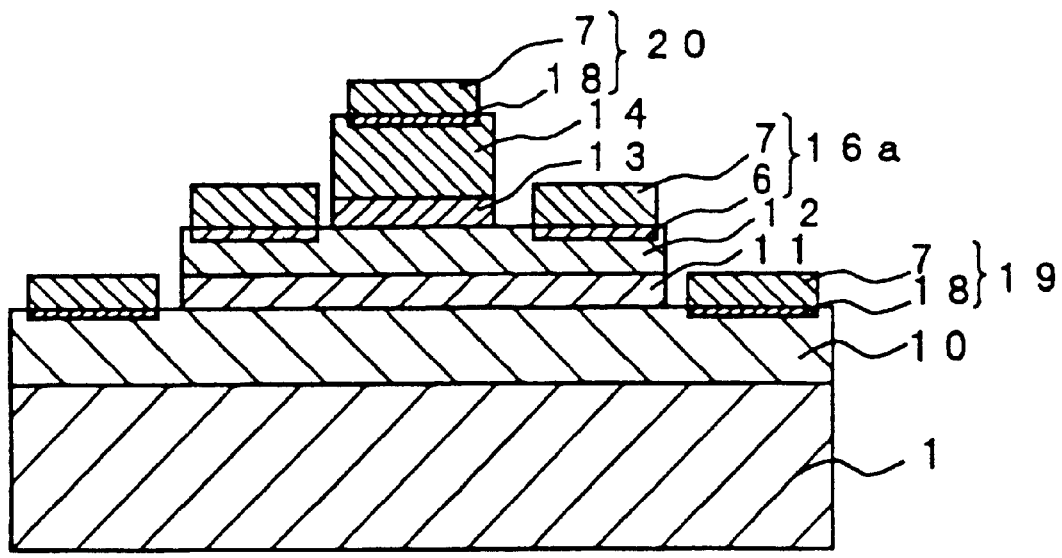
FIG. 6 is a cross sectional view showing another hetero-junction bipolar transistor according to the present invention.

Turning to FIG. 6 of the drawings, another hetero-junction bipolar transistor embodying the present invention is fabricated on a semi-insulating substrate 1 of GaAs. On the semi-insulating substrate 1 is grown a sub-collector layer 10 of heavily-doped n-type GaAs on which a collector electrode 19 is formed. A collector layer 11 of lightly-doped n-type GaAs, a base layer 12 of heavily-doped p-type GaAs, an emitter layer 13 of n-type AlGaAs and an emitter cap layer 14 of heavily-doped n-type InGaAs are successively laminated over the sub-collector layer 11 as similar to the hetero-junction bipolar transistor shown in FIG. 5. A base electrode 16a and an emitter electrode 20 are formed on the base layer 12 and the emitter cap layer 14, respectively.

The collector electrode 19 is a kind of the ohmic electrode according to the present invention, and includes an n-type InGaAs layer 18 and a PdIn alloy layer 7. The emitter electrode 20 also has the n-type InGaAs layer 18 and the PdIn alloy layer 7. The base electrode 16a is another kind of ohmic contact according to the present invention, and includes a p-type InGaAs layer 6 and a PdIn alloy layer 7.

In this instance, all the electrodes 19/16a/20 are of the ohmic electrode described in conjunction with FIGS. 3A to 3D. The collector/base/emitter electrodes 19/16a/20 are reliable, thermally stable and reproducible. Any noble metal is not used for the ohmic electrodes, and the fabrication process consists of the known technologies. Thus, the production yield is enhanced, and the production cost is reduced.

Third Embodiment

Figure 7:
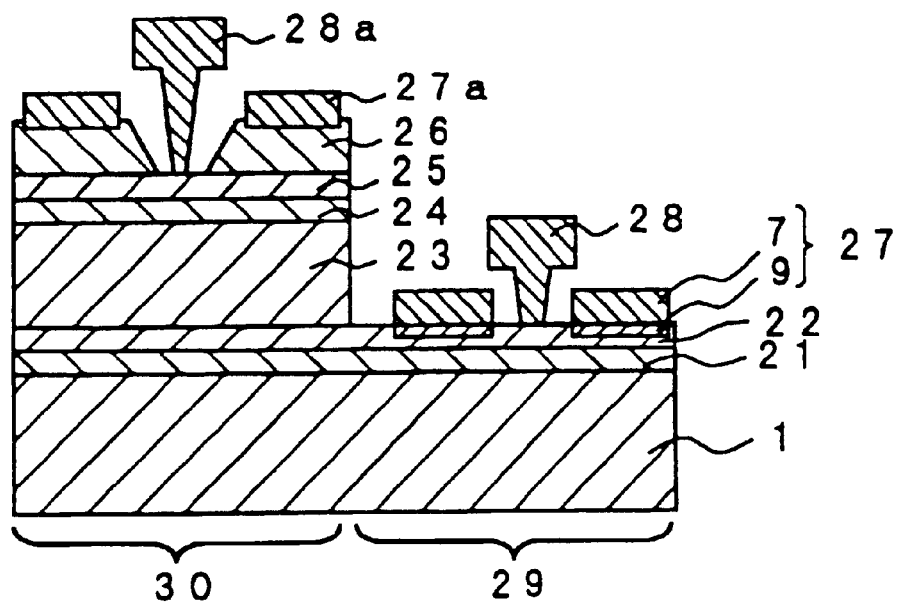
FIG. 7 is a cross sectional view showing a complementary hetero-junction field effect transistor according to the present invention.

FIG. 7 illustrates a hetero-junction complementary field effect transistor embodying the present invention. The hetero-junction field effect transistor is fabricated on a semi-insulating substrate 1 of GaAs. A channel layer 21 of undoped InGaAs and an electron supply layer 22 of p-type AlGaAs are successively grown on the semi-insulating substrate 1. The right portion of the resultant structure is assigned to a p-type hetero-junction field effect transistor 29. On the left portion of the electron supply layer 22 are further grown an undoped GaAs layer 23, a channel layer 24 of undoped InGaAs, an electron supply layer 25 of n-type AlGaAs and a cap layer 26 of heavily-doped n-type GaAs layer, which form in combination an n-type hetero-junction field effect transistor 30. In the fabrication process, the right portions of the cap/electron supply/channel/undoped GaAs layers 26/25/24/23 are etched away in an etching gas in chlorine system or through a wet etching technique using phosphoric acid or citric acid so that the right portion of the electron supply layer 22 is exposed.

Source/drain electrodes 27 are formed on the electron supply layer 22, and are spaced from each other. A gate electrode 28 is formed on the electron supply layer 22 between the source/drain electrodes 27, and are electrically isolated from the source/drain electrodes 27. The gate electrode 28 has a T-letter shaped cross section.

The undoped GaAs layer 23, the channel layer 24, the electron supply layer 25 and the cap layer 26 are successively grown through a molecular beam epitaxy or a metalorganic vapor phase epitaxy.

The cap layer 26 is selectively etched away in an etching gas in chlorine system or through a wet etching technique using phosphoric acid or citric acid. A recess is formed in the cap player 26, and the electron supply layer 26 is exposed to the recess. Source/drain electrodes 27a are formed on the cap layer 26 on both sides of the recess, and a gate electrode 28a is formed on the electron supply layer 25 exposed to the recess.

The source/drain electrodes 27 have the same structure as the ohmic electrode 7/6 or 7/9. On the other hand, the source/drain electrodes 27a have a conventional structure produced as follows. First, a photo-resist mask is formed on the cap layer 26, and AuGe and Ni are deposited by using an evaporation. The AuGe layer and the Ni layer are partially removed through a lift-off technique, and the AuGe layer and the Ni layer are alloyed through a heat treatment.

The gate electrodes 28/28a have another confessional structure produced as follows. First, a photo-resist mask is formed, and titanium and aluminum are successively deposited through a vacuum evaporation technique. The titanium layer and the aluminum layer are partially removed by using a lift-off technique, and the gate electrodes 28/28a are left on the electron supply layers 22/25, respectively. Otherwise, tungsten silicide WSi is deposited through a sputtering technique, and a photo-resist etching mask is formed on the tungsten silicide layer. The tungsten silicide layer is selectively etched away by using a dry etching, and the gate electrodes 28/28a are left on the electron supply layers 22/25, respectively.

The source/drain electrodes 27 are reproducible, highly reliable and thermally stable, and enhances the production yield. Any noble metal is not used for the source/drain electrodes 27, and the fabrication process consists of the known technologies. Thus, the ohmic electrodes 27 according to the present invention reduce the production cost of the hetero-junction complementary field effect transistor.

Fourth Embodiment

Figure 8:
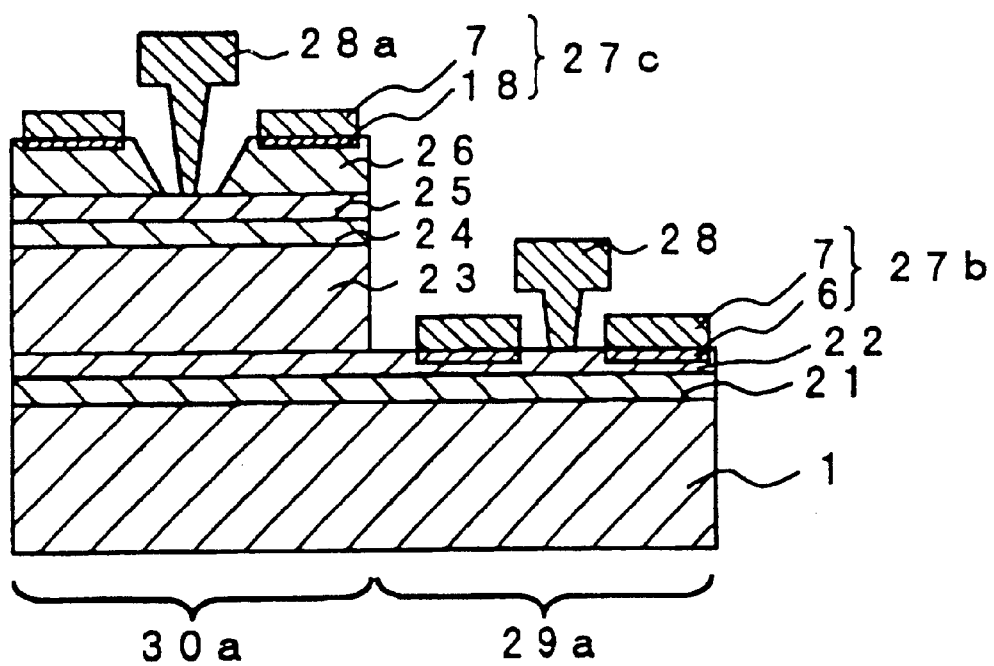
FIG. 8 is another cross sectional view showing a complementary heterojunction field effect transistor according to the present invention.

Turning to FIG. 8 of the drawings, another hetero-junction complementary field effect transistor is fabricated on a semi-insulating substrate of GaAs. The hetero-junction complementary field effect transistor is a combination of a p-type hetero-junction field effect transistor 29a and an n-type hetero-junction field effect transistor 30a. These field effect transistors 29a/30a are similar to the field effect transistors 29/30 except source drain electrodes 27b/27c. For this reason, compound semiconductor layers of the field effect transistors 29a/30a are labeled with the same references designating corresponding compound semiconductor layers of the field effect transistors 29/30 without detailed description.

The source/drain electrodes 27b are formed on the electron supply layer 22, and are spaced from each other. The gate electrode 28 is formed on the electron supply layer 22, and is electrically isolated from the source/drain electrodes 27b. On the other hand, the source/drain electrodes 27c are formed on the cap layer 26 on both sides of the recess, and the gate electrode 28a is formed on the electron supply layer 25 exposed to the recess.

The source/drain electrodes 27b/27c have the same structure as the ohmic electrode 7/6 and/or 7/9. In this instance, each of the source/drain electrodes 27c has the n-type InGaAs regrown layer 18 under the PdIn alloy layer 7, and arc of the ohmic contact implementing the first embodiment. If all of the source/drain electrodes 27b/27c have the same structure as the ohmic electrode implementing the first embodiment, the source/drain electrodes 27b/27c arc concurrently produced, and make the fabrication process simple.

In the fabrication process, the undoped GaAs layer 23, the channel layer 24, the electron supply layer 25 and the cap layer 26 are successively grown through a molecular beam epitaxy or a metalorganic vapor phase epitaxy. The right portions of the cap/electron supply/channel/undoped GaAs layers 26/25/24/23 are etched away in an etching gas in chlorine system or through a wet etching technique using phosphoric acid or citric acid so that the right portion of the electron supply layer 22 is exposed. The cap layer 26 is selectively etched away in an etching gas in chlorine system or through a wet etching technique using phosphoric acid or citric acid so as to form the recess. The gate electrodes 28/28a have a conventional structure produced as follows. First, a photo-resist mask is formed, and titanium and aluminum are successively deposited through a vacuum evaporation technique. The titanium layer and the aluminum layer are partially removed by using a lift-off technique, and the gate electrodes 28/28a are left on the electron supply layers 22/25, respectively. Otherwise, tungsten silicide WSi is deposited through a sputtering technique, and a photo-resist etching mask is formed on the tungsten silicide layer. The tungsten silicide layer is selectively etched away by using a dry etching, and the gate electrodes 28/28a are left on the electron supply layers 22/25, respectively.

The source/drain electrodes 27b/27c are reproducible, highly reliable and thermally stable, and enhances the production yield. Any noble metal is not used for the source/drain electrodes 27, and the fabrication process consists of the known technologies. Thus, the ohmic electrodes 27b/27c according to the present invention reduce the production cost of the hetero-junction complementary field effect transistor.

Although particular embodiments of the present invention have been shown and described, it will be apparent to those skilled in the art that various changes and modifications may be made without departing from the spirit and scope of the present invention.

In the above-described embodiments, the ohmic electrodes 6/7 and 7/9 are produced on the p-type gallium arsenide layer 2. However, III–V compound semiconductor is never limited to the p-type gallium arsenide. The ohmic electrode according to the present invention may be produced on intentionally undoped GaAs, InGaAs, AlGaAs or InP, which may be grown on a gallium arsenide substrate or a silicon substrate. Of course, an ohmic electrode may be produced on a gallium arsenide substrate or an indium phosphide substrate.

In the above-described embodiments, indium is used as the first element. However, the first element is never limited to the indium. Other elements are usable as the first element in so far as the element produces a mixed crystal having a potential barrier to metal less than the potential barrier between the III–V compound semiconductor and the metal. Antimony is another example of the first element.

The second element is never limited to palladium. Palladium-indium alloy has the melting point at 1285 degrees in centigrade, and is well resistive against heat. The surface morphology is unchanged through the heat treatment at 400 degrees in centigrade for ten hours. Thus, palladium is appropriate. However, other elements are usable as the second element in so far as the element is alloyed with the first element for producing a refractory alloy and reactive with the III–V compound semiconductor. Nickel, cobalt and platinum are examples of the second element.

The annealing temperature is never limited to 350 degrees in centigrade and 5 minutes. Following phenomena take place in the annealing. The palladium reacts with the p-type gallium arsenide, and, thereafter, the indium reacts with the p-type gallium arsenide through the solid-phase epitaxial process. The p-type InGaAs layer is regrown, and the PdIn alloy layer is produced on the p-type InGaAs layer. The above-described phenomena proceed in a wide temperature range from 300 degrees to 600 degrees in centigrade, and the p-type InGaAs layer and the PdIn alloy layer decreases the contact resistance to less than a tenth of the contact resistance of between the prior art ohmic electrode and the III–V compound semiconductor.

Only hydrogen is introduced as the reducing gas in the above description. However, the reducing gas is never limited to hydrogen. Other examples of the reducing gas are HI, CO, $SO_2$, $N_2H_4$, $NH_3$, $SiH_4$, $Si_2H_6$, $PH_3$, $H_2S$, $AsH_3$ and $H_2Se$. The reducing gas may be diluted in inert gas.

The collector/base/emitter electrodes of the first embodiment may be replaced with the ohmic contact described in conjunction with FIGS. 4A to 4D.

What is claimed is:

1. A compound semiconductor device comprising
   a substrate,
   at least one active layer formed of a first compound semiconductor material capable of producing a first Schottky barrier together with a metal and formed over said substrate, and
   at least one electrode formed on said at least one active layer and including
   a first layer formed of a second compound semiconductor material containing a first element and the elements of said first compound semiconductor material and capable of producing a second Schottky barrier lower than said first Schottky barrier together with said metal and
   a second layer formed of a refractory alloy containing said first element and a second element.

2. The compound semiconductor device as set forth in claim 1, in which said first compound semiconductor material is doped with a p-type dopant impurity.

3. The compound semiconductor device as set forth in claim 1, in which said first compound semiconductor material is doped with an n-type dopant impurity.

4. The compound semiconductor device as set forth in claim 1, in which said first compound semiconductor material is a III–V binary compound semiconductor.

5. The compound semiconductor device as set forth in claim 4, in which said III–V binary compound semiconductor material is gallium arsenide.

6. The compound semiconductor device as set forth in claim 5, in which said gallium arsenide is doped with a p-type dopant impurity.

7. The compound semiconductor device as set forth in claim 5, in which said gallium arsenide is doped with an n-type dopant impurity.

8. The compound semiconductor device as set forth in claim 1, in which said first compound semiconductor material is a III–V ternary compound semiconductor material.

9. The compound semiconductor device as set forth in claim 1, in which said first element is selected from the group consisting of indium and antimony.

10. The compound semiconductor device as set forth in claim 1, in which said second element is selected from the group consisting of palladium, nickel, cobalt and platinum.

11. The compound semiconductor device as set forth in claim 1, in which said first element and said second element are selected from the group consisting of indium and antimony and the group consisting of palladium, nickel, cobalt and platinum, respectively, and said first compound material is gallium arsenide doped with one of a p-type dopant impurity and an n-type dopant impurity.

12. The compound semiconductor device as set forth in claim 1, in which said second compound material is heavily doped with a third element serving as a dopant impurity.

13. The compound semiconductor device as set forth in claim 12, in which said third element is selected from the group consisting of zinc, manganese, magnesium, beryllium, carbon, germanium and silicon.

14. The compound semiconductor device as set forth in claim 1, further comprising another active layer formed of a third compound semiconductor material and yet another active layer formed of a fourth compound semiconductor material,
   said at lest one active layer, said another active layer and said yet another active layer selectively serving as a collector, a base and an emitter of a hetero-junction bipolar transistor.

15. The compound semiconductor device as set forth in claim 14, further comprising another electrode similar in structure to said at least one electrode and formed on one of said another active layer and said yet another active layer and yet another electrode similar to said at least one electrode and formed on another of said another active layer and said yet another active layer, said at lest one electrode, said another electrode and said yet another electrode selectively serving as a collector electrode, a base electrode and an emitter electrode.

16. The compound semiconductor device as set forth in claim 1, further comprising
   another electrode similar in structure to said at least one electrode, formed on said at least one active layer and spaced from said at least one electrode so as to serve as source and drain electrodes, and
   a gate electrode formed on said at least one active layer between said at least one electrode and said another electrode.

17. The compound semiconductor device as set forth in claim 16, in which said at least one active layer serves as a carrier supply layer, said compound semiconductor device further comprising another active layer formed of a third compound semiconductor material formed under said at least one active layer and serving as a channel layer.

18. The compound semiconductor device as set forth in claim 17, further comprising
   a semi-insulating layer of a fourth compound semiconductor material formed on a part of said at least one active layer,
   another channel layer of a fifth compound semiconductor material formed on said semi-insulating layer and providing a conductive channel,
   another carrier supply layer of a sixth compound semiconductor material formed on said another channel layer and supplying a carrier to said another channel layer,
   source and drain electrodes formed on said another carrier supply layer and spaced from each other, and
   another gate electrode formed on said another carrier supply layer between said source and drain electrodes.

19. The compound semiconductor device as set forth in claim 18, in which said source and drain electrodes have the same structure as said at least one electrode.

* * * * *